(12) United States Patent
Lee et al.

(10) Patent No.: US 6,333,635 B1
(45) Date of Patent: *Dec. 25, 2001

(54) PROBE CARD FOR TESTING AN INTEGRATED CIRCUIT CHIP

(75) Inventors: Han-shik Lee; Hoon-jung Kim, both of Suwon (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,435

(22) Filed: Sep. 1, 1998

(30) Foreign Application Priority Data

Nov. 18, 1997 (KR) .................................. 97-60898
May 14, 1998 (KR) .................................. 98-17391

(51) Int. Cl.⁷ .................................. G01R 31/02
(52) U.S. Cl. ............................. 324/754; 324/758
(58) Field of Search .................. 324/754, 755, 324/761, 762, 72.5, 758, 757; 439/482, 824

(56) References Cited

U.S. PATENT DOCUMENTS

| | | | |
|---|---|---|---|
| 4,362,991 | * 12/1982 | Carbine | 324/754 |
| 4,719,417 | * 1/1988 | Evans | 324/72.5 |
| 4,780,670 | * 10/1988 | Cherry | 324/754 |
| 5,412,329 | 5/1995 | Iino et al. | 324/754 |
| 5,982,184 | * 11/1999 | Hasegawa | 324/754 |

* cited by examiner

*Primary Examiner*—Vinh P. Nguyen
(74) *Attorney, Agent, or Firm*—Volentine Francos PLLC

(57) ABSTRACT

A probe card for use in testing at least two Quad Pad IC chips at the same time, includes a printed circuit board having an aperture extending therethrough, a plurality of pins for probing contact pads formed on the chips and electrically connected to the circuitry of the printed circuit board, a fixing ring extending around the aperture and positioning the pins relative to the test chips, and a fixing bridge traversing the fixing ring and disposed over a region between two of the test chip locations. Those pins which are for contacting the contact pads closest to the fixing ring protrude from and are supported by the sides of the fixing ring. On the other hand, the contact pads which will lie rather far from the sides of the fixing ring are probed by pins protruding from and supported by the fixing bridge.

18 Claims, 7 Drawing Sheets

PROBE CARD FOR TESTING AN INTEGRATED CIRCUIT CHIP

BACKGROUND OF THE INVENTION

1. Field of the Invention

The present invention relates to a probe card for testing integrated circuit chips. More particularly, the present invention relates to a probe card for testing the electrical characteristics of at least two Quad Pad chips at the same time.

2. Description of the Related Art

Generally speaking, various kinds of processing steps are involved in the fabrication of semiconductor devices. These processes can be roughly divided into those for forming integrated circuits on a wafer by repeatedly carrying out a step of producing a specific pattern on the wafer, and those associated with the assembly of the devices including a process of slicing the wafer into unit chips and a process of packaging the chips.

Before the wafer is sliced into unit chips, the electrical characteristics of each portion of a wafer corresponding to a unit chip is tested by an Electrical Die Sorting (EDS) process.

The EDS process is used to examine all of the chips formed on the wafer so that inferior chips can be reworked or removed prior to their assembly into the semiconductor devices. Thus, EDS aims to save the assembly costs associated with forming semiconductor devices from defective or inferior chips.

The EDS process is carried out using a probe card. U.S. Pat. No. 5,412,329 discloses a conventional one of such probe cards as fully illustrated in FIG. 4. FIG. 1 shows the conventional testing apparatus making use of the probe card.

Referring now to FIG. 1, the testing apparatus includes a test section 3, and a loading/unloading device 2 for transporting a wafer 20 to be examined from a cassette (not shown) into the test section 3. The test section 3 encloses a stage 9 on which the wafer 20 is mounted, and a lower CCD (Charge Coupled Device) camera 8. The test apparatus also includes a test head 7, and an upper CCD camera 6 disposed over the test section 3. The test head 7 is connected to a testing module 5 which is backed-up by a CPU 4. A probe card having a printed circuit board 12 and a plurality of pins 10 is detachably mounted to the lower surface of the test head 7 by means of a holder (not shown). The probe card faces a wafer 20 mounted on the stage 9 disposed within the test section 3. The stage 9 can be driven in X, Y and Z directions and about an axis θ according to control signals generated by the CPU 4 on the basis of signals received by the CPU 4 from the upper and lower CCD cameras 6, 8.

When the testing apparatus is used, a certain electrical signal is applied from the testing module 5 through the pins 10 to the chips on the wafer 20. A signal from the integrated circuits (ICs) on the chips is then transferred back to the testing module 5. The CPU 4 can determine whether the ICs conform to design parameters based on the signals received by the testing module 5.

Meanwhile, with the development of high-speed devices such as semiconductor memory devices, etc., and of compact chips, the layout of the chips in modern semiconductor devices is changing rapidly. Current layouts include the so-called quad-pad or fine-pitch types. In addition, EDS testing has been improved beyond its original ability to test only one wafer at a time. Now, EDS apparatus have been designed to perform multi-parallel testing such as dual testing, quad testing, octal testing, and hexa-testing.

FIG. 2 illustrates a conventional probe card of an EDS testing apparatus designed to carry out a conventional dual test. The probe card is removably mounted on the test head by means of a holder. The probe card includes a printed circuit board 12, and a plurality of pins 10 integrated with the circuit board 12. The printed circuit board 12 has an aperture 11 extending through an inner central portion thereof so that the contact of the pins 10 with contact pads 22 (see FIG. 4) of the chips being tested can be observed by the upper CCD camera 6.

The probe card shown in FIG. 2 is a dual test probe card which is intended to test, at the same time, the electrical characteristics of at least two chips disposed at a first test chip location T1 and a second test chip location T2, respectively. Also, the probe card shown in FIG. 2 is designed to test a quad-pad type of chip having a plurality of contact pads located along all four of its sides.

FIG. 3 shows a portion of a wafer 20 forming a plurality of unit chips 24. Each of the unit chips 24 is to be provided with an IC to form a quad-pad type of chip testable by the probe card of FIG. 2. The unit chips 24 of the wafer 20 are thus provided with a plurality of contact pads 22 along each of four edges thereof, which edges will become the peripheral edge of the quad-pad type of chip. Once the ICs are formed on the unit chips 24, the chips will be EDS tested by placing the contact pads 22 in contact with the pins 10 of the probe card. Once the EDS testing is completed, the wafer 20 is sliced along the scribe lines 26 to separate the chips from one another. Thereafter, the chips are packaged to complete the production of the semiconductor devices.

Referring again to FIG. 4, a frame comprising the pins 10 is soldered to the printed circuit board (PCB) 12. The PCB 12 has a test circuit pattern 13 configured in accordance with the EDS testing to be conducted. The number and location of the ends of the pins 10 correspond to those of the contact pads 22. An insulating fixing ring 14 extends around the aperture 11 of the PCB 12 at the bottom surface of the PCB 12. The pins 10 are attached to the fixing ring 14 by electrically insulative epoxy resin 16.

Each of several characteristics of the probe card can greatly affect the EDS test. These characteristics include the tip length "b" of the pins 10 (the length of the bent tips of the pin which contact the contact pads 22), the angle "a" at which the tips subtend with the portions of the pins from which the tips are bent, an incident angle "c" of the pins 10, the pin diameter "d", and the pin extension length "e" (the horizontal distance between the location where the pins are held fixed by the fixing ring 14 and the pin tips).

Referring back to FIG. 2, most of the pins 10 extend from locations all lying in the same horizontal plane as fixed together by the fixing ring (not visible) disposed at the lower surface of the print circuit board 12. However, those pins 10 which are to contact the contact pads 22 close to the region lying between the first test chip location T1 and the second test chip location T2, are arranged vertically as shown in FIG. 5 and FIG. 6.

For this group of pins 10, the tip length varies from a tip length 'b1' (the length of the pin tip lying closest to the fixing ring 14) to a tip length 'b9' (the length of the pin tip located on the middle of the group).

FIG. 7 shows the allocation of the pins 10 of the conventional probe card used in carrying out a quad test (in the drawing, the printed circuit board is omitted). This probe card is designed to test four chips at the same time, and as with the probe card shown in FIG. 2 for use in carrying out the dual test, the pins 10 which are to contact the contact pads lying at the regions between the first test chip location T1 and the second test chip location T2, and between the second test chip location T2 and the third test chip location T3, and between the third test chip location T3 chip location and the fourth test chip location T4, are vertically mounted to the fixing ring 14.

Therefore, this probe card has several portions in which pins are arranged vertically as shown in FIG. 5 and 6.

Accordingly, like the probe card shown in FIG. 2, this probe card has pin characteristics, such as pin tip length, which vary. Because, as mentioned above, such characteristics can affect the EDS test, the varying characteristics compromise the reliability of the EDS test.

In addition, the contact resistance of the pins becomes greater the further up one goes in the multi-layered vertical structure thereof. Such a wide variation in the values of the contact resistance of the pins also compromises the reliability of the EDS test to the point where the test can yield widely different results when testing the same lot of wafers a number of different times.

In addition, the unstable contact provided by the pins of the conventional probe card produce conditions during testing which result in the need to clean the tips of the pins frequently. This limits the efficiency with which the EDS testing can be carried out.

SUMMARY OF THE INVENTION

An object of the present invention is to substantially overcome one or more of the problems, limitations and disadvantages of the related art.

More specifically, one object of the present invention is to provide a design of a probe card for testing integrated circuit chips (IC chips) in which the number of probe pins does not compromise the reliability of the EDS test carried out with the probe card.

Another object of the present invention is to provide a probe card for testing IC chips in which the contact resistance of the pins is maintained within a relatively small range under which the reliability of the EDS test remains high.

A still further object of the present invention is to provide a probe card for testing IC chips and which does not require a frequent cleaning of the pin tips during a prolonged period of use, thereby contributing to the efficiency under which the EDS test can be carried out.

To achieve these objects, the probe card for testing integrated circuit chips (IC chips) comprises: a printed circuit board having test circuit patterns configured to test the electrical characteristics of at least two chips at the same time, and having an aperture sized to accommodate the chips to be tested; a plurality of pins for probing contact pads formed on the chips and electrically connected to the test circuit patterns of the printed circuit board; a fixing ring extending around the aperture of the print circuit board, and fixing the pins in place; and a fixing bridge traversing the fixing ring near a region between two neighboring chips to be tested, and supporting some of the pins for probing the contact pads formed close to the region between the two neighboring chips.

These pins for probing the contact pads adjacent the region between the two neighboring chips include a first set of pins symmetrically protruding from opposite sides of the fixing ring toward a central location, and second pins protruding from the fixing bridge. The first pins protrude from the lowermost locations in the probe card and have tips contacting the contact pads closest to the fixing ring. On the other hand, the second pins are used to contact the contact pads at the center of the region between the two neighboring chips.

The second pins, because they are supported by the fixing bridge and despite extending to the contact pads at the center of the region between the two neighboring chips, can protrude from the uppermost locations in the probe card without being very long, i.e. without having a contact resistance that is much greater than that of any of the first pins contacting the contact pads closest to the sides of the fixing ring.

In fact, the pins that are supported by the fixing bridge are those whose tips would ordinarily have to be longer than 1000 $\mu$m if they were instead coming to the same contact pads from the fixing ring. Because the tips of all of the pins can thus have minimal lengths, the pins each offer a correspondingly small contact resistance.

Preferably, the pins supported by the fixing bridge all protrude therefrom from the same level and therefore, have tips of equal lengths. With so many of the tips having the same length, the testing does not produce conditions requiring the tips to be frequently cleaned for good contact with the contact pads.

The probe card of the present invention can take the form of a dual test probe card capable of testing the electrical characteristics of two chips is at a time, a quad test probe card capable of testing the electrical characteristics of four chips at a time, a hexa test probe card capable of testing the electrical characteristics of six chips at a time, and even an octal test probe card capable of testing the electrical characteristics of eight chips at a time.

When the present invention takes the form of a dual test probe card, a fixing bridge can be disposed directly over the region between the two test chip locations, or one test bridge is disposed directly over the region between the two test chip locations while another fixing bridge is disposed directly over one side of a test chip location adjacent the region, or two fixing bridges can be respectively disposed over the sides of the test chip locations adjacent the region.

When the probe card is a quad test probe card, respective fixing bridges extend directly over the right side of the first test chip location, the region between the first and the second test chip locations, the right side of the second test chip location, the left side of the third test chip location, the region between the third and the fourth test chip locations, and the left side of the fourth chip test chip location. At such locations the fixing bridges are positioned symmetrically with respect to the region between the second and third test chip locations.

DETAILED DESCRIPTION OF THE PREFERRED EMBODIMENTS

The preferred embodiments of the present invention will now be described more fully hereinafter with reference to the accompanying drawings.

Figure 1:
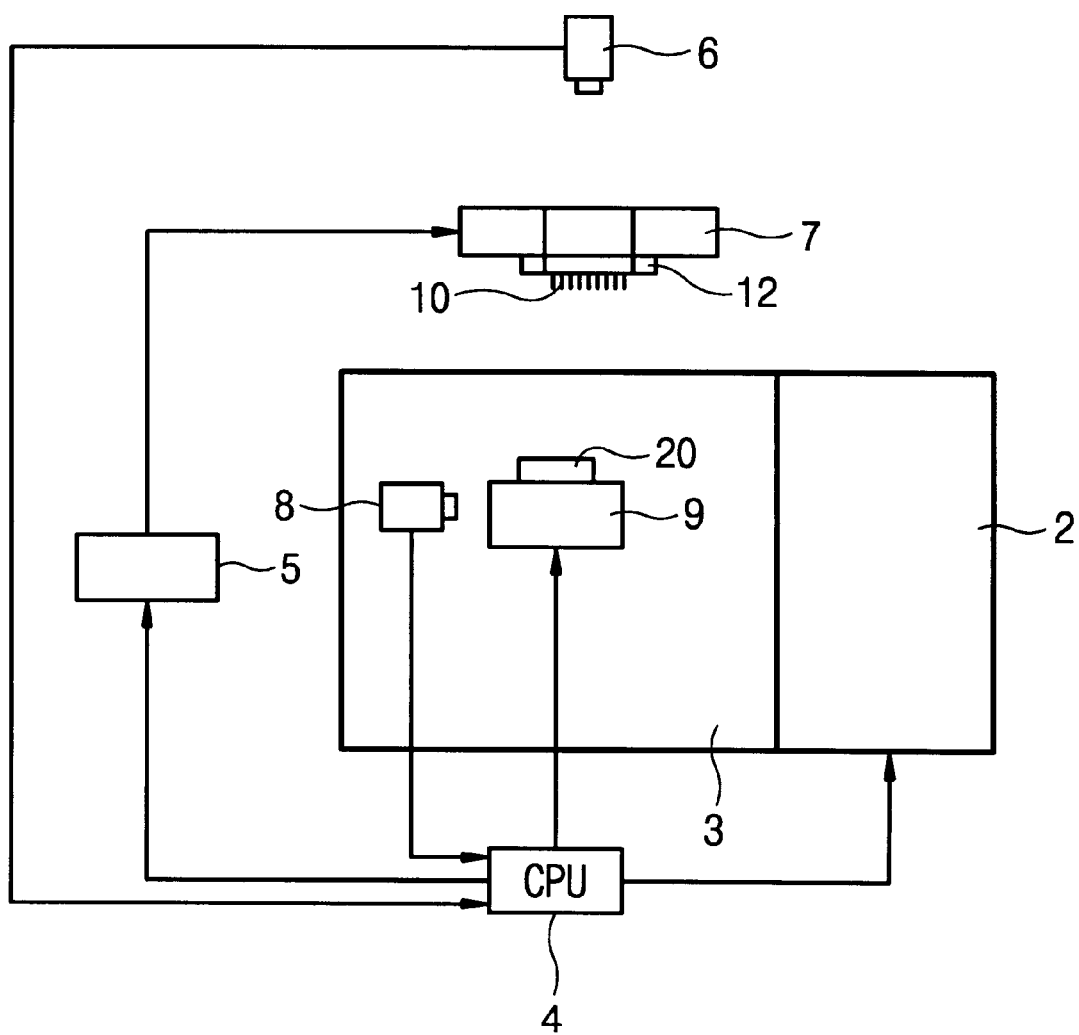
FIG. 1 is a schematic diagram of a conventional Electrical Die Sorting (EDS) test apparatus.
Figure 2:
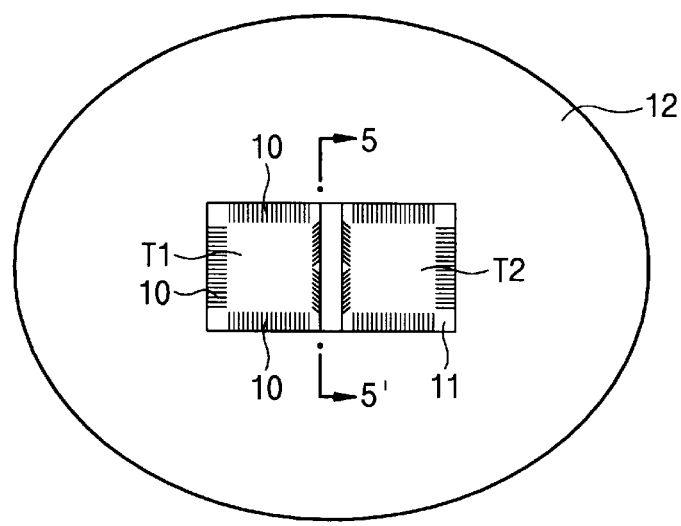
FIG. 2 is a plan view of a conventional probe card used by the Electrical Die Sorting (EDS) test apparatus for carrying out a dual test of integrated circuit chips.
Figure 3:
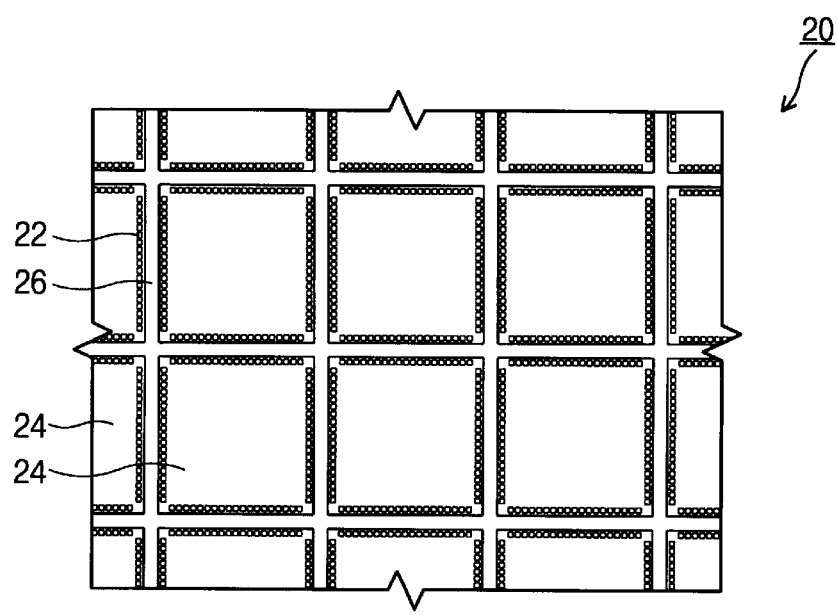
FIG. 3 is a plan view of part of a wafer having contact pads provided thereon for electrically connecting ICs to the probe card.
Figure 4:
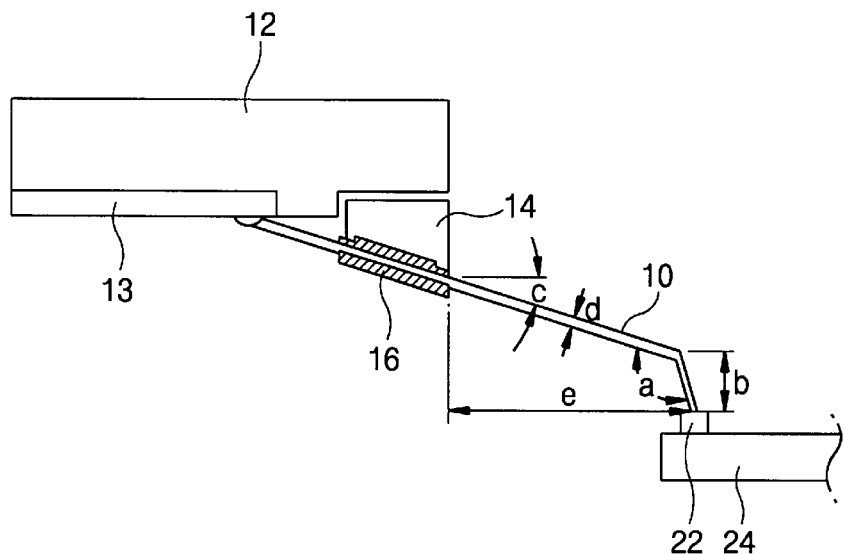
FIG. 4 is a cross-sectional view of the conventional probe card.
Figure 5:
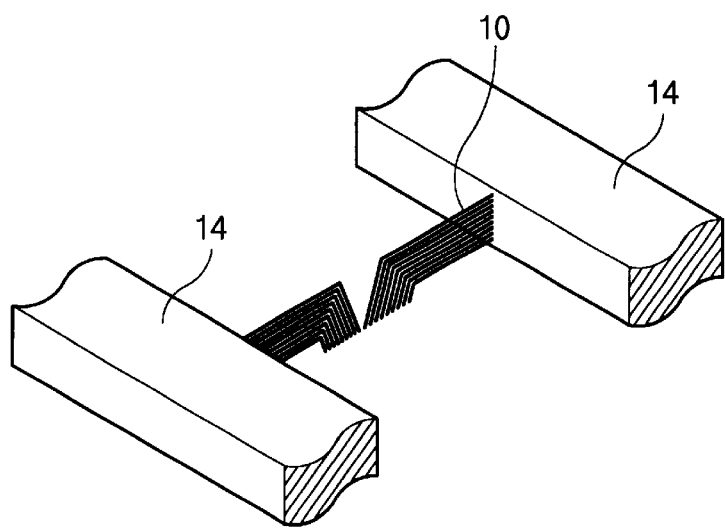
FIG. 5 is a perspective view of the pins of the probe card as viewed in the direction of line 5–5' of FIG. 2.
Figure 6:
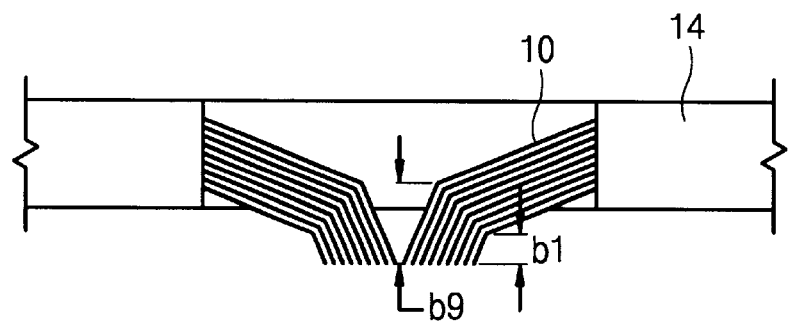
FIG. 6 is a sectional view of the conventional probe card taken along line 5–5' of FIG. 2, showing the allocation of a group of pins of the probe card.
Figure 7:
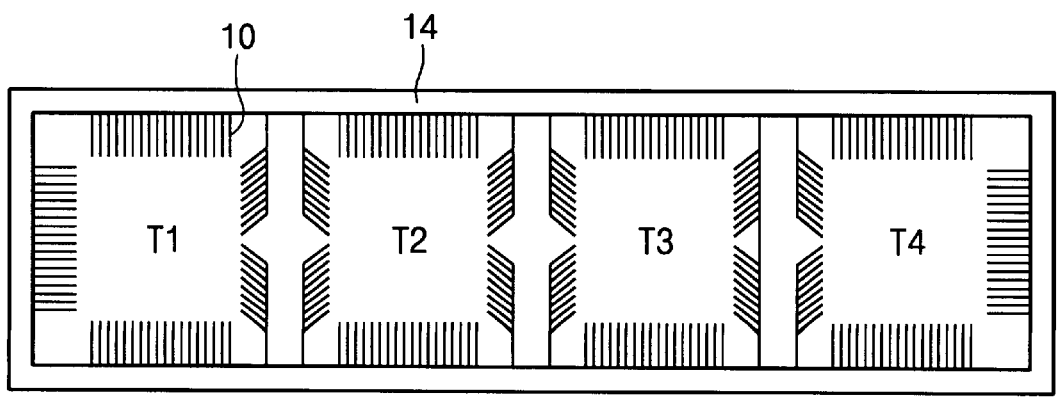
FIG. 7 is a plan view of a conventional probe card used by the Electrical Die Sorting (EDS) test apparatus for carrying out a quad test of integrated circuit chips.

However, first, the characteristics of the vertical multi-layered pins shown in FIGS. 5 and 6 of the conventional probe card are listed in Table 1 below. Again, these are the characteristics which have been determined to significantly influence the results of an EDS test.

In addition, the ideal incident angle of the probe pins has been determined to be 6°. However, in the conventional probe card, the incident angles increase well beyond 6°. This is also responsible for a more frequently-occurring "sliding" phenomena and the contact-miss as a result.

Based on the factors analyzed above, the pins of the probe card of the present invention are arranged so as not to compromise the reliability of the EDS test.

In one embodiment of the present invention, only three pins at most are provided in a vertically coplanar arrangement on the fixing ring. Those pins which are necessary to contact the remaining contact pads are fixed in a horizontal array to a horizontally extending fixing bridge. In this embodiment, therefore, the tip length of the pins is no more than approximately 1000 $\mu$m (i.e., no more than that of the $4^{th}$ pin from Table 1).

Figure 8:
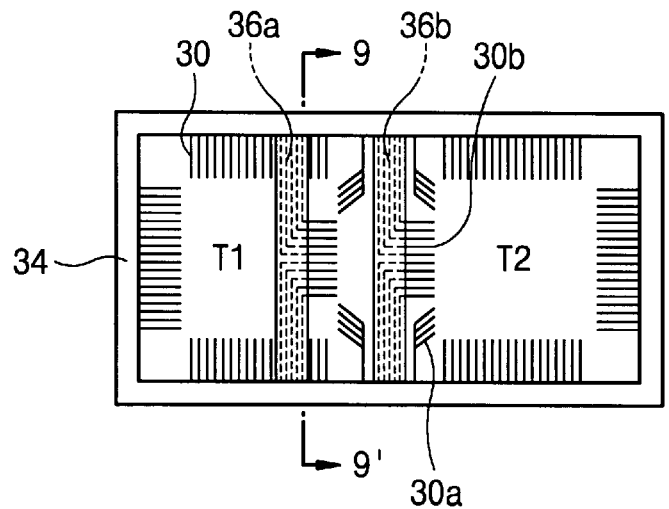
FIG. 8 is a plan view of one embodiment of a probe card, used by the Electrical Die Sorting (EDS) test apparatus for carrying out a dual test of integrated circuit chips, according to the present invention.

However, it is understood that the present invention is not limited to the number of pins aligned vertically on the sides of the fixing ring. Various numbers of such vertically aligned pins may be used as long as such does not compromise the reliability of the EDS testing to any significant extent beyond that shown herein Referring now to FIGS. 8 to 10, first ones 30a of the pins 30 which are to contact the chip pads (not shown) formed on the adjacent peripheral portions of two neighboring chips (i.e., in the region between the first test location T1 and the second test chip location T2) are fixed to a rectangular fixing ring 34. The remainder (second ones 30b) of such pins 30 are fixed to fixing bridges 36a, 36b. The fixing bridges 36a, 36b are made of an electrically insulative material such as ceramic. The fixing ring 34 is also made of an electrically insulative material such as ceramic. The fixing ring 34 and the fixing bridges 36a, 36b are part of a unitary member or are separate members attached to one another so as to be integral.

When the probe card is in use, the fixing bridges 36a, 36b extend above and close to the region between the first test chip location T1 and the second test chip location T2 so that most of the contact between the pins of the probe card and the contact pads of the IC chips can be observed by the upper CCD camera. In the embodiment shown in FIG. 8, the fixing bridge 36a extends over the first test chip location T1

TABLE 1

| Element | Probe Pin Characteristics | | | | | | | |
|---|---|---|---|---|---|---|---|---|
| | 1 | 2 | 3 | 4 | 5 | 6 | 7 | 8 |
| tip length: b ($\mu$m) | 250 | 450 | 700 | 950 | 1250 | 1550 | 1900 | 2250 |
| tip incl. angle: a (°) | 103 | 103 | 103 | 103 | 103 | 103 | 103 | 103 |
| incident angle: c (°) | 6.0 | 7.0 | 8.0 | 9.0 | 10.0 | 11.0 | 12.0 | 13.0 |
| pin dia.: d ($\mu$m) | 200 | 200 | 250 | 250 | 300 | 300 | 350 | 350 |

The tip length, tip inclination angle, incident angle, and pin diameter, etc. are important design parameters in establishing the quality of a probe card. The contact resistance of a pin depends on the tip length of the pin. Because the tips of the vertically arrayed pins become longer amongst the pins as seen in a progression toward the top of the probe card, the contact resistance of the probe pins increases correspondingly. A pin having too high of a contact resistance can adversely affect the reliability of an EDS test. Especially in the case of over-driving, beyond the fifth one of the vertically arranged pins there occurs more frequently a "sliding" phenomena between the pin and contact pad which results in the mal-functioning of the probe card.

whereas the second fixing bridge 36b extends over the region between the first test chip location T1 and the second test chip location T2.

The fixing bridges 36a, 36b are positioned considering the extension length of the pins. Each bridge can be in the form of a rod having a square cross section. The fixing bridges as shown in FIGS . 9 and 10, extend across the upper portion of the fixing ring 34, the fixing ring 34 itself extending around the aperture formed in the printed circuit board of the probe card. The fixing bridge 36b extends at the same level as the fixing bridge 36a with respect to the fixing ring 34.

Figure 9:
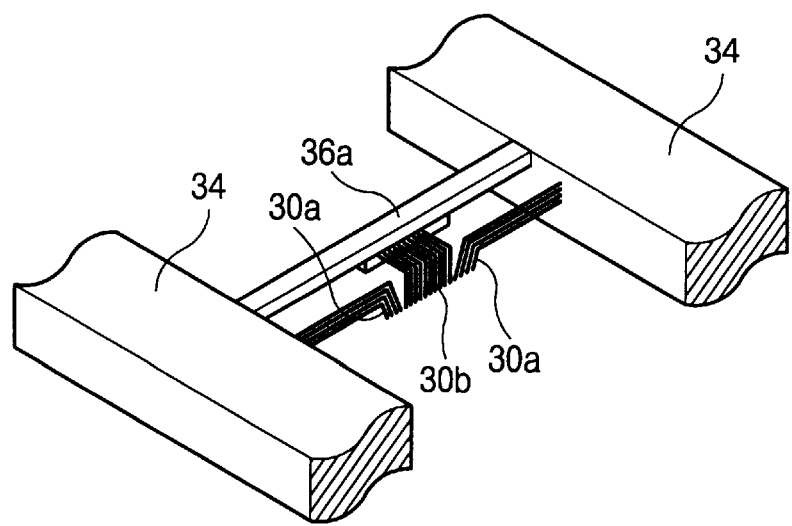
FIG. 9 is a perspective view of the pins of the probe card as viewed in the direction of line 9–9' of FIG. 8.
Figure 10:
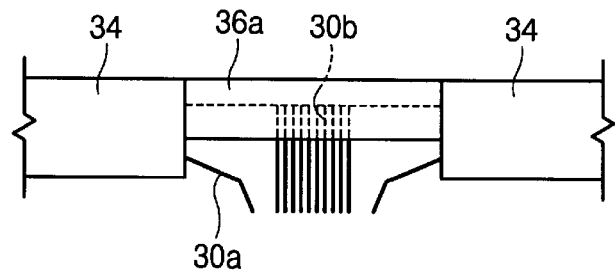
FIG. 10 is a sectional view of the probe card taken along line 9–9' of FIG. 8, showing the allocation of a group of pins of the probe card.

Moreover, all of the pins 30 that are fixed to a fixing bridge 36a or 36b protrude from the bridge at the same level, as shown in FIGS. 9 and 10.

The pins 30 are formed of a tungsten or Al—Cu alloy, and they are fixed to the fixing ring 34 or the fixing bridges 36a, 36b by means of an electrically insulative bonding material such as epoxy resin.

Figure 11:
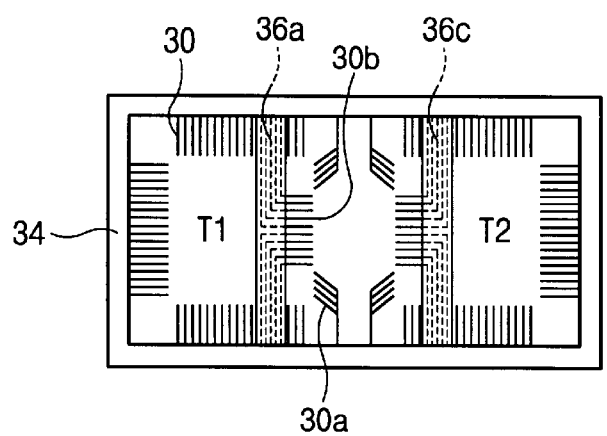
FIG. 11 is a plan view of another embodiment of a probe card, used by the Electrical Die Sorting (EDS) test apparatus for carrying out a dual test of integrated circuit chips, according to the present invention.

FIG. 11 shows another embodiment of the present invention in which the fixing bridges 36a, 36c extend over the test chip locations T1 and T2, respectively. In this figure, the PCB is omitted for the-sake of clarity.

Figure 12:
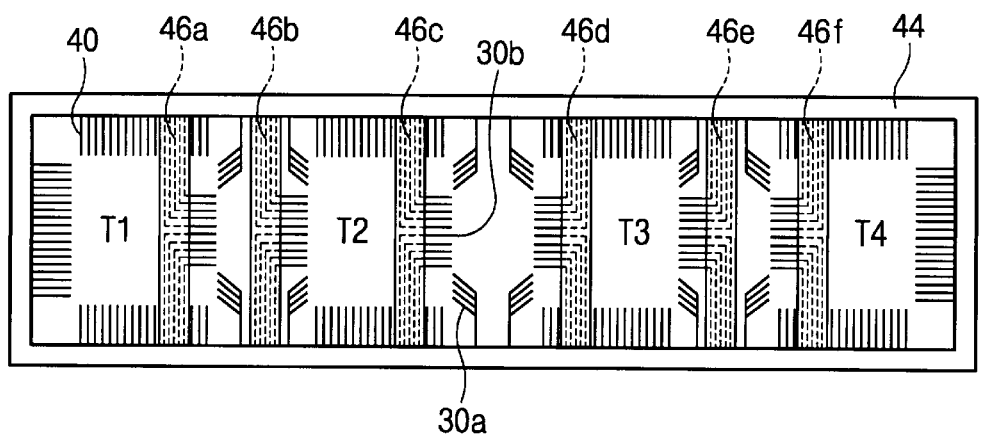
FIG. 12 is a plan view of part of another embodiment of a probe card, used by the Electrical Die Sorting(EDS) test apparatus for carrying out a quad test of integrated circuit chips, according to the present invention.

FIG. 12 shows an embodiment by which four chips aligned in a row can be tested at the same time. In this embodiment, six fixing bridges 46a, 46b, 46c, 46d, 46e, 46f traverse the fixing ring 44. Of the pins 40 which are used to contact the contact pads adjacent the regions between neighboring chips, namely the region between the test chip locations T1 and T2, the region between the test chip locations T2 and T3, and the region between the test chip locations T3 and T4, some of the pins are directly fixed to the fixing ring 44 whereas others are fixed to the fixing bridges 46a, 46b, 46c, 46d, 46e, and 46f. The present invention is not, however, limited to the layout of the fixing bridges shown in FIG. 12.

Figure 13:
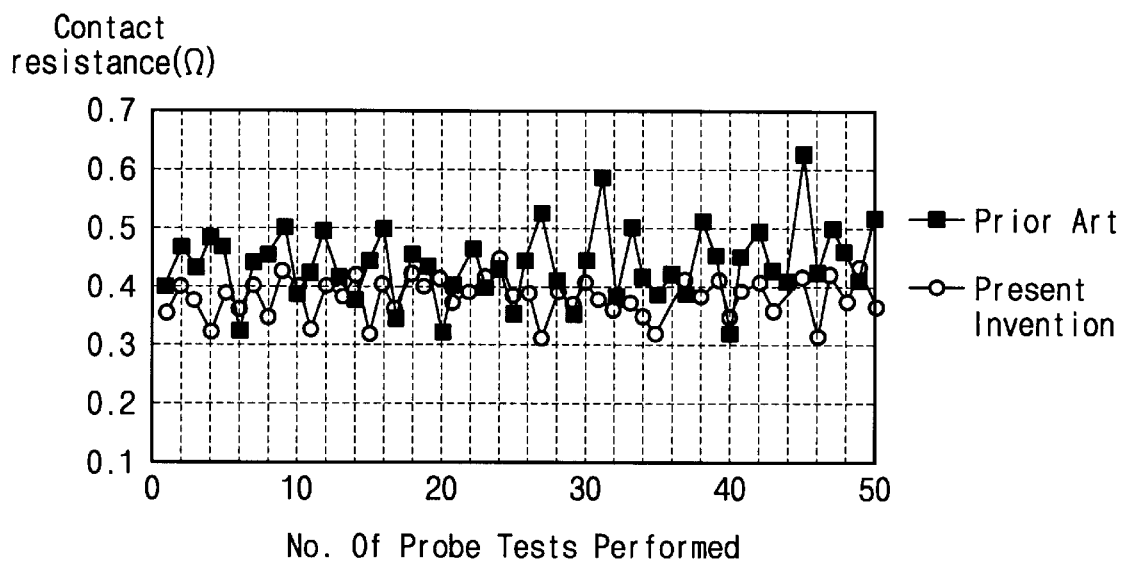
FIG. 13 is a graph showing the relationship between the contact resistance of the probe card and the number of uses of the probe card.

FIG. 13 compares the performance of the conventional probe card having two multi-layered vertical structures of 9 pins (FIGS. 5 and 6) with a probe card of the present invention wherein the pin layout comprises two multi-layered vertical structures of only 4 pins. As shown in FIG. 13, the initial contact resistance of gold-plated tungsten probe pins is less than 0.5 Ω for both probe cards, but as the number of times the probe cards are put to the test is increased, the initial contact resistance of the conventional probe card ranges anywhere between 0.3 to 0.7 Ω). The higher values affect the reliability of the EDS test. On the contrary, the probe card of the present invention maintains a low contact resistance of around 0.4 Ω. The probe card of the present invention thus continues to produce reliable results for a long period of time.

Moreover, because the contact resistance is maintained, the tip cleaning and the reference test associated therewith can be performed much less frequently. That is, in case of the conventional quad test probe card having a multi-layered vertical structure of 9 pins, tip cleaning and the reference test were carried out eight times for every run of 25 wafers. However, with a quad test probe card according to the present invention, the EDS test can be conducted continuously for three runs without tip cleaning. As a result, the productivity of the EDS test is greatly increased when the probe card of the present invention is used.

Figure 14:
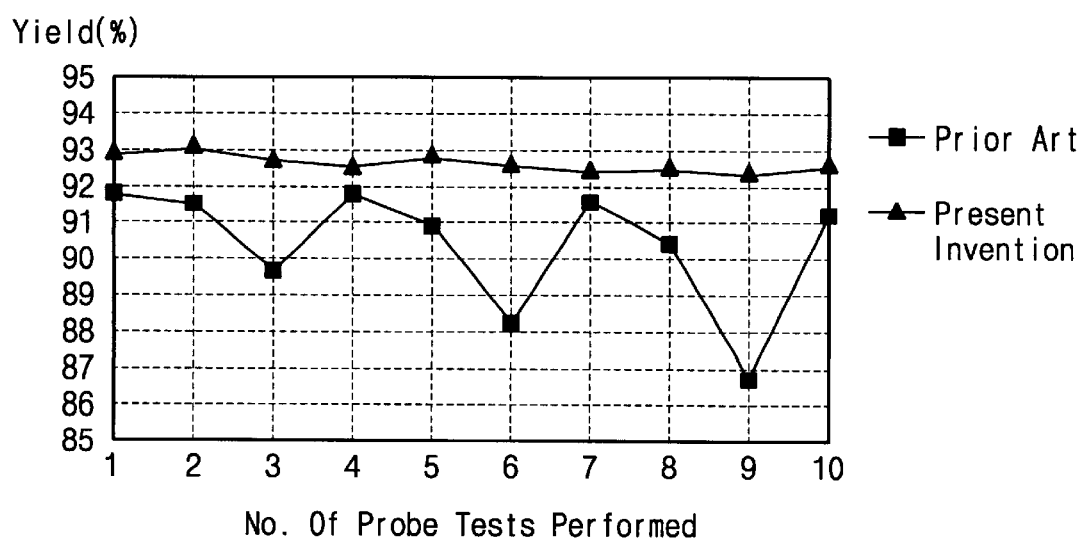
FIG. 14 is graph showing the relationship between the yield and the number of EDS test performances using the probe card.

FIG. 14 shows the changes of the yield with the increase in the number of EDS tests performed, when the conventional quad test probe card having two multi-layered vertical structures of 9 pins is used and when the quad test probe card of the present invention having the fixing bridges and two multi-layered vertical structures of 4 pins is used. In the FIG. 14, the percentage of good chips uncovered by EDS testing a lot consisting of 100% good chips is plotted along the Y axis. When using the conventional probe card, the yield varies quite a bit over the ten tests. Furthermore, the yield was determined as less than 90% by the 3rd, 6th, and 9th times the test was performed. This indicates that tip cleaning is required after testing three runs of the test. However, using the present invention, the yield is maintained at around 93%. That is, the present invention facilitates highly reliable EDS testing. In addition, the present invention allows the EDS testing to be carried out productively by making it unnecessary to frequently clean the pin tips.

Although the present invention has been described with respect to the preferred embodiments thereof, various changes and modifications thereto will readily occur to those skilled in the art. For example, the present invention is not limited to the number of pins aligned vertically on the sides of the fixing ring. Various numbers of such vertically aligned pins may be used as long as such does not compromise the reliability of the EDS testing to any significant extent beyond that shown herein. Accordingly, all such changes and modifications are seen to be within the true spirit and scope of the is present invention as defined by the appended claims.

What is claimed is:

1. A probe card for testing IC chips, said probe card comprising:

a printed circuit board having test circuit patterns configured to test electrical characteristics of at least two integrated circuit chips, and at least one aperture extending therethrough sized to accommodate at least two of the integrated circuit chips to be tested;

a plurality of probe pins for use in probing contact pads of the chips, said probe pins being electrically connected to the test circuit patterns of said printed circuit board, said probe pins comprising a first group of probe pins and a second group of probe pins;

a fixing ring extending around said aperture of the printed circuit board, the first group of probe pins being fixed to and protruding from said fixing ring; and at least one fixing bridge traversing said fixing ring from one side thereof to the other, the second group of probe pins being fixed to and protruding from said fixing bridge, wherein the first group of probe pins and the second group of probe pins contact one of the integrated circuit chips in a straight line, and wherein the first group of probe pins comprises more than two pins.

2. The probe card for testing IC chips according to claim 1, wherein said probe pins have tips terminating at locations lying in a group of rectangular patterns, each of said rectangular patterns corresponding to a layout of contact pads of a quad type of integrated circuit chip, and the rectangular patterns of the tips of said probe pins being disposed side-by-side at test chip locations, respectively, and spaced apart to leave a region between adjacent ones of the test chip locations, whereby some of said probe pins have tips terminating at the border of said region.

3. The probe card for testing IC chips according to the claim 2, wherein the probe pins having tips terminating at the border of said region protrude toward said border from several levels spaced vertically from one another, wherein the first group of probe pins protrude symmetrically from opposite sides of said fixing ring and the second group of probe pins protrude from said fixing bridge, said second group of probe pins protruding from said fixing bridge at a level above that from which at least some of the first group of a probe pins protrude from said fixing ring.

4. The probe card for testing IC chips according to claim 3, wherein the tips of said second group of probe pins are located between the tips of said first group of probe pins, wherein said first and second groups of probe pins protrude toward said border from at least first, second and third levels spaced vertically from one another as taken in a direction from the bottom of said fixing ring toward the printed circuit board, and wherein the only ones of said probe pins which protrude toward said border from locations above said second level are said second group of probe pins.

5. The probe card for testing IC chips according to claim 3, wherein the tips of said second group of probe pins are located between the tips of said first group of probe pins, wherein said first and second groups of probe pins protrude toward said border from at least first, second, third, fourth and fifth levels spaced vertically from one another as taken in a direction from the bottom of said fixing ring toward the printed circuit board, and wherein the only ones of said probe pins which protrude toward said border from locations above said fourth level are said second group of probe pins.

6. The probe card for testing IC chips according to claim 3, wherein the length of the tips of each of said probe pins is less than 1000 $\mu$m.

7. The probe card for testing IC chips according to claim 3, wherein all of said second group of probe pins protrude from said fixing bridge at the same level.

8. The probe card for testing IC chips according to claim 3, wherein the tips of said second group of probe pins all have the same length.

9. The probe card for testing IC chips according to claim 1, wherein the test circuit patterns of said printed circuit board are configured to test electrical characteristics of two integrated circuit chips, the aperture extending through the printed circuit board is sized to accommodate only two integrated circuit clips to be tested, said probe pins have tips terminating at locations lying in a group of two patterns, and each of said patterns corresponds to a layout of contact pads of an integrated circuit chip, whereby the probe card is a dual test probe card for use in testing the electrical characteristics of two chips at a time.

10. The probe card for testing IC chips according to claim 9, wherein the patterns of the tips of said probe pins are disposed side-by-side with a respective space left therebetween corresponding to a region between two adjacent test chip locations, and said at least one fixing bridge comprises a fixing bridge extending directly over said region.

11. The probe card for testing IC chips according to claim 9, wherein the patterns of the tips of said probe pins are disposed side-by-side with a respective space left therebetween corresponding to a region between two adjacent test chip locations, and said at least one fixing bridge comprises a fixing bridge extending directly over a side of one of said test chip locations adjacent said region.

12. The probe card for testing IC chips according to claim 1, wherein the test circuit patterns of said printed circuit board are configured to test electrical characteristics of four integrated circuit chips, the aperture extending through the printed circuit board is sized to accommodate four integrated circuit chips to be tested, said probe pins have tips terminating at locations lying in a group of four patterns, and each of said patterns corresponds to a layout of contact pads of an integrated circuit chip.

13. The probe card for tasting IC chips according to claim 12, wherein the patterns of the tips of said probe pins ate disposed side-by-side with first, second and third spaces left therebetween, respectively, corresponding to first, second and third regions between adjacent ones of four side-by-side test chip locations, and wherein said at least one fixing bridge comprises a first fixing bridge extending directly over a side of said first test chip location adjacent said first region, a second fixing bridge extending directly over said first region, a third fixing bridge extending directly over a side of said second test chip location adjacent said second region, a fourth fixing bridge extending directly over a side of said third chip location adjacent said second region, a fifth fixing bridge extending directly over said third region, and a sixth fixing bridge extending directly over a side of said fourth test chip location adjacent said third region.

14. The probe card for testing IC chips according to claim 1, wherein said fixing ring is rectangular.

15. The probe card for testing IC chips according to claim 1, wherein said fixing ring and said at least one fixing bridge are formed as a single continuous unit.

16. The probe card for testing IC chips according to claim 1, wherein said fixing ring and said at least one fixing bridge are ceramic.

17. The probe card for testing IC chips according to claim 1, wherein epoxy resin fixes said pins to said fixing ring and to said fixing bridge, respectively.

18. The probe card for testing IC chips according to claim 1, wherein said probe pins arc of tungsten.

* * * * *